United States Patent
Batra et al.

(10) Patent No.: US 9,966,793 B2
(45) Date of Patent: May 8, 2018

(54) SUPPLY-SWITCHING SYSTEM

(71) Applicant: NXP USA, Inc., Austin, TX (US)

(72) Inventors: Ashita Batra, Patiala (IN); Mayank Jain, Ambala Cantt (IN)

(73) Assignee: NXP USA, INC., Austin, TX (US)

( * ) Notice: Subject to any disclaimer, the term of this patent is extended or adjusted under 35 U.S.C. 154(b) by 0 days. days.

(21) Appl. No.: 15/646,085

(22) Filed: Jul. 10, 2017

(65) Prior Publication Data

US 2017/0310159 A1 Oct. 26, 2017

Related U.S. Application Data

(62) Division of application No. 14/280,659, filed on May 18, 2014, now Pat. No. 9,735,614.

(51) Int. Cl.
| | |
|---|---|
| *H02J 1/10* | (2006.01) |
| *H02J 9/06* | (2006.01) |
| *H03K 17/687* | (2006.01) |
| *H03K 17/693* | (2006.01) |

(52) U.S. Cl.
CPC .............. *H02J 9/061* (2013.01); *H02J 1/10* (2013.01); *H03K 17/687* (2013.01); *H03K 17/693* (2013.01); *H03K 2217/0018* (2013.01); *Y10T 307/625* (2015.04)

(58) Field of Classification Search
CPC .................. H02J 1/10; H02J 9/61; H02J 7/00
USPC .......................................................... 307/66
See application file for complete search history.

(56) References Cited

U.S. PATENT DOCUMENTS

| | | | |
|---|---|---|---|
| 4,451,742 A | 5/1984 | Aswell | |
| 5,428,252 A | 6/1995 | Walker et al. | |
| 5,886,561 A | 3/1999 | Eitan | |
| 7,286,005 B2 | 10/2007 | Jiang | |
| 7,535,284 B2 | 5/2009 | Ito | |
| 7,800,433 B2 | 9/2010 | Yoshikawa | |
| 7,973,595 B2 | 7/2011 | Kimura | |
| 8,653,884 B2 | 2/2014 | Miwa et al. | |
| 2004/0095021 A1* | 5/2004 | Fogleman | H02J 1/102 307/52 |

* cited by examiner

*Primary Examiner* — Rexford Barnie
*Assistant Examiner* — Joseph Inge
(74) *Attorney, Agent, or Firm* — Charles E. Bergere

(57) ABSTRACT

A system for providing a first voltage generated by a main supply and a second voltage generated by a battery to an integrated circuit (IC) includes supply-selection, control logic and switching circuits. The supply-selection circuit includes first, second, and third transistors. The switching circuit includes fourth and fifth transistors that supply the first and second voltages to the IC when switched on. The supply-selection circuit selects and provides the higher of the first and second voltages to body terminals of the fourth and fifth transistors for maintaining required body-bias voltage conditions. The control logic circuit generates a first control signal as long as the first voltage is within a predetermined range for keeping the fourth transistor switched on and a second control signal when the first voltage is not within the predetermined range for switching on the fifth transistor to supply the second voltage.

17 Claims, 6 Drawing Sheets

SUPPLY-SWITCHING SYSTEM

BACKGROUND OF THE INVENTION

The present invention relates generally to integrated circuits, and, more particularly, to a power supply switching circuit for an integrated circuit.

Electronic devices such as metering devices and data converters include internal circuitry powered by a main supply. Some of the internal circuitry, such as dynamic random access memory (DRAM) and system clock circuits, are required to operate in the absence of the main supply. One way of powering the internal circuitry is by using a battery when the main supply is cut-off such as in the event of power failure or when the electronic device enters a low power mode. However, batteries only hold charge for a limited time period.

Supply-switching circuits are commonly used to toggle between the main supply and the battery. A supply-switching circuit connects the internal circuitry to the main supply when the main supply is available and to the battery when the main supply is unavailable. The supply-switching circuit is required to accurately monitor the voltage levels of the main supply and the battery to determine the switching point.

FIG. 1A shows a schematic circuit diagram of a conventional supply-switching system 100 connected between a main supply 102 and a battery 104. The supply-switching system 100 includes a switching circuit 105 and a supply-selection circuit 106. The switching circuit 105 includes first and second transistors 108 and 110 and a first diode 112. The first and second transistors 108 and 110 are p-channel metal-oxide semiconductor (PMOS) transistors. The supply-selection circuit 106 includes an inverter 114 and a logic circuit 116. The logic circuit 116 is connected to the main supply 102 and the battery 104 for receiving the main supply and battery voltages, respectively. The logic circuit 116 includes a comparator (not shown) that compares the main supply and battery voltages and outputs a first control signal based on the comparison. The inverter 114 is connected to the logic circuit 116 for receiving the first control signal and generating a second control signal. The logic circuit 116 is powered by the main supply voltage and the inverter 114 is powered by the battery. A source terminal of the first transistor 108 is connected to the main supply 102 for receiving the main supply voltage. A gate terminal of the first transistor 108 is connected to the logic circuit 116 for receiving the first control signal. When the main supply voltage is available (i.e., when the main supply voltage is within a predetermined range), a voltage at a drain terminal of the first transistor 108 equals the main supply voltage. When the main supply voltage is unavailable (i.e., when the main supply voltage is not within the predetermined range or switched off), the voltage at the drain terminal of the first transistor 108 equals the battery voltage. Thus, a body terminal of the first transistor 108 is connected to the drain terminal thereof so that a voltage at the body terminal of the first transistor 108 is always greater than or equal to the main supply voltage received at the source terminal thereof, thereby meeting a body-bias voltage requirement of the PMOS transistor. A source terminal of the second transistor 110 is connected to the battery 104 for receiving the battery voltage. A gate terminal of the second transistor 110 is connected to the inverter 114 for receiving the second control signal. A body terminal of the second transistor 110 cannot be connected to the drain terminal thereof as either of the source or drain terminals of the second transistor 110 may be at a higher voltage at any point of time. Therefore, the first diode 112 is included having a p-terminal connected to the drain terminal of the second transistor 110 and an n-terminal connected to the drain terminal of the first transistor 108, which also forms an output terminal of the switching circuit 105. The first diode 112 ensures that the source terminal of the second transistor 110 is always at a higher voltage than the drain terminal thereof and reduces leakage of the battery 104. Thus, the body terminal of the second transistor 110 is connected to the source terminal thereof, thereby meeting the body-bias voltage requirement of the PMOS transistor.

When the main supply voltage is greater than the battery voltage, the first control signal sets the gate terminal of the first transistor 108 low, thereby switching on the first transistor 108. The second control signal sets the gate terminal of the second transistor 110 high, thereby switching off the second transistor 110. When the battery voltage is higher than the main supply voltage, the first control signal sets the gate terminal of the first transistor 108 high, thereby switching off the first transistor 108, and the second control signal sets the gate terminal of the second transistor 110 low, thereby switching on the second transistor 110. The first transistor 108 conducts the main supply voltage and the second transistor 110 conducts the battery voltage to the output terminal of the switching circuit 105, when the respective transistors are switched on.

However, the supply-selection circuit 106 selects the battery 104 when the battery voltage is greater than the main supply voltage, even when the main supply voltage is within the predetermined range. Additionally, the first diode 112 introduces a diode drop (e.g., 0.7 V) causing a reduction in the battery voltage obtained at the output terminal of the switching circuit 105. Use of additional electronic components, such as the comparator, further increases the cost of production and overall chip area.

FIG. 1B shows an alternate implementation of the conventional supply-selection system 100. The supply-selection system 100 of FIG. 1B includes the switching circuit 105, a control logic circuit 117, and a supply-selection circuit 118 that selects and provides the higher of the main supply and battery voltages to the switching circuit 105. The supply-selection circuit 118 includes second and third diodes 120 and 122. The second diode 120 has a p-terminal connected to the battery 104 and an n-terminal connected to an n-terminal of the third diode 122 to form an output terminal of the supply-selection circuit 118. A p-terminal of the third diode 122 is connected to the main supply 102. The output terminal of the supply-selection circuit 118 is connected to the control logic circuit 117 and body terminals of the first and second transistors 108 and 110 for outputting a selected voltage. The control logic circuit 117 is connected to the gate terminals of the first and second transistors 108 and 110 for generating first and second control signals, respectively, based on the selected voltage. When the battery voltage is greater than the main supply voltage, the second diode 120 conducts the battery voltage as the selected voltage to the output terminal of the supply-selection circuit 118. Upon receiving the battery voltage as the selected voltage, the control logic circuit 117 generates the first control signal at logic high state and the second control signal at logic low state. As a result, the first transistor 108 is switched off because its gate terminal receives the first control signal, which is at logic high state. The second transistor 110 is switched on because its gate terminal receives the second control signal, which is at logic low state. When the main supply voltage is greater than the battery voltage, the third diode 122 conducts the main supply voltage as the selected voltage to the output terminal of the supply-selection circuit 118. On receiving the main supply voltage as the selected voltage, the control logic circuit 117 generates the first control signal, which is at logic low state, and the second control signal, which is at logic high state. As a result, the gate terminal of the first transistor 108 is low, thereby switching on the first transistor 108, and the gate terminal of the second transistor 110 is high, thereby switching off the second transistor 110. The body terminals of the first and second transistors 108 and 110 always receive a higher voltage, since the output terminal of the supply-selection circuit 118 outputs the higher of the main supply and battery voltages as the selected voltage, and hence, the need for the first diode 112 in the switching circuit 105 is eliminated. However, the second and third diodes 120 and 122 introduce a diode drop (e.g. 0.7 V) causing a reduction in the selected voltage, and hence, the first and second control signals do not completely switch off either of the first and second transistors 108 and 110.

FIG. 1C shows yet another implementation of the conventional supply-selection system 100. The supply-selection system 100 of FIG. 1C includes the switching circuit 105, the control logic circuit 117, and a supply-selection circuit 124 that selects and provides a higher of the main supply and battery voltages to the switching circuit 105. The supply-selection circuit 124 includes third and fourth transistors 126 and 128. The third transistor 126 has a source terminal connected to the battery 104 for receiving the battery voltage, a body terminal connected to its drain terminal, and a gate terminal connected to the main supply 102 for receiving the main supply voltage. The fourth transistor 128 has a source terminal connected to the main supply 102 for receiving the main supply voltage, a body terminal connected to its drain terminal, and a gate terminal connected to the battery 104 for receiving the battery voltage. The drain terminal of the fourth transistor 128 is connected to the drain terminal of the third transistor 126 to form an output terminal of the supply-selection circuit 124. The output terminal of the supply-selection circuit 124 is connected to the control logic circuit 117 and body terminals of the first and second transistors 108 and 110 for outputting the selected voltage. The control logic circuit 117 is connected to the gate terminals of the first and second transistors 108 and 110 for generating the first and second control signals, respectively, based on the selected voltage.

When the battery voltage is greater than the main supply voltage, the gate terminal of the third transistor 126 is low. The third transistor 126 is switched on and conducts the battery voltage as the selected voltage to the output terminal of the supply-switching circuit 124. Upon receiving the battery voltage as the selected voltage, the control logic circuit 117 generates the first control signal, which is at logic high state and the second control signal, which is at logic low state. As a result, the gate terminal of the first transistor 108 is pulled down, thereby switching off the first transistor 108 and the gate terminal of the second transistor 110 is pulled down, thereby switching on the second transistor 110. When the main supply voltage is greater than the battery voltage, the gate terminal of the fourth transistor 128 is at logic low state. The fourth transistor 128 is switched on and conducts the main supply voltage as the selected voltage to the output terminal of the supply-switching circuit 124. Upon receiving the main supply voltage as the selected voltage, the control logic circuit 117 generates the first control signal, which is at logic low state and the second control signal, which is at logic high state. As a result, the gate terminal of the first transistor 108 is pulled down to logic low state, thereby switching on the first transistor 108 and the gate terminal of the second transistor 110 is pulled down to logic high state, thereby switching off the second transistor 110. The output terminal of the supply-switching circuit 124 always outputs the higher of the main supply and battery voltages as the selected voltage to the body terminals of the first and second transistors 108 and 110, thereby meeting the body-bias voltage requirements of the first and second transistors 108 and 110. However, when the difference between the main supply and battery voltages is small, the gate terminals of the third and fourth transistors 126 and 128 are both at logic high states, thereby simultaneously switching off the third and fourth transistors 126 and 128. As a result, the logic states of the first and second control signals are indeterminate and hence, the first and second transistors 108 and 110 are set to an indeterminate state.

FIG. 1D shows yet another implementation of the conventional supply-selection system 100. The supply-selection system 100 of FIG. 1D includes the switching circuit 105, the control logic circuit 117, and a supply-selection circuit 130 that selects and provides the higher of the main supply and battery voltages to the switching circuit 105. The supply-selection circuit 130 includes fifth and sixth transistors 132 and 134, fourth and fifth diodes 136 and 138, and first and second fixed-current sources 140 and 142. The fifth transistor 132 has a source terminal connected to the battery 104 and a p-terminal of the fifth diode 138, a body terminal connected to its drain terminal, and a gate terminal connected to an n-terminal of the fourth diode 136. The sixth transistor 134 has a source terminal connected to the main supply 102 and a p-terminal of the fourth diode 136, a body terminal connected to its drain terminal, and a gate terminal connected to an n-terminal of the fifth diode 138. The drain terminal of the sixth transistor 134 is connected to the drain terminal of the fifth transistor 132 to form an output terminal of the supply-selection circuit 130. The n-terminal of the fourth diode 136 is connected to the first fixed-current source 140 and the n-terminal of the fifth diode 138 is connected to the second fixed-current sources 142 for tracking the main supply and battery voltages, respectively. The output terminal of the supply-selection circuit 130 is connected to the control logic circuit 117 and body terminals of the first and second transistors 108 and 110 for outputting the selected voltage. The control logic circuit 117 is connected to the gate terminals of the first and second transistors 108 and 110 for generating the first and second control signals, respectively, based on the selected voltage.

When the battery voltage is greater than the main supply voltage, the gate terminal of the fifth transistor 132 receives the main supply voltage by way of the fourth diode 136, which is less than the battery voltage received at the source terminal thereof. Hence, the gate terminal of the fifth transistor 132 is at logic low state. The gate terminal of the sixth transistor 134 receives the battery voltage by way of the fifth diode 138, which is greater than the main supply voltage received at the source terminal thereof. Hence, the gate terminal of the sixth transistor 134 is at logic high state. As a result, the sixth transistor 134 is switched off and the fifth transistor 132 is switched on. The fifth transistor 132 conducts the battery voltage to the output terminal of the supply-selection circuit 130. On receiving the battery voltage as the selected voltage, the control logic circuit 117 generates the first control signal at logic high state and the second control signal at logic low state. As a result, the gate terminal of the first transistor 108 is at logic high state, thereby switching off the first transistor 108 and the gate terminal of the second transistor 110 is at logic low state, thereby switching on the second transistor 110. When the main supply voltage is greater than the battery voltage, the gate terminal of the sixth transistor 134 is at logic low state and the gate terminal of the fifth transistor 132 is at logic high state, thereby switching off the fifth transistor 132 and switching on the sixth transistor 134. The sixth transistor 134 conducts the main supply voltage to the output terminal. On receiving the main supply voltage as the selected voltage, the control logic circuit 117 generates the first control signal at logic low state and the second control signal at logic high state. As a result, the gate terminal of the first transistor 108 is at logic low state, thereby switching on the first transistor 108 and the gate terminal of the second transistor 110 is at logic high state, thereby switching off the second transistor 110. The output terminal of the supply-switching circuit 130 always outputs the higher of the main supply and battery voltages as the selected voltage to the body terminals of the first and second transistors 108 and 110, thereby meeting the body-bias voltage requirements of the first and second transistors 108 and 110. The fourth and fifth diodes 136 and 138 introduce diode drops (e.g. 0.7 V) at the gate terminals of the fifth and sixth transistors 132 and 134, respectively. Hence, the gate terminals of the fifth and sixth transistors 132 and 134 cannot be at logic high state at the same time. Therefore, the fifth and sixth transistors 132 and 134 are not simultaneously switched off even when the difference between the main supply and battery voltages is small. However, the first fixed-current source 140 receives a constant current from the battery 104, causing considerable leakage of the battery 104 and decreasing the battery-life.

It would be advantageous to have a supply-selection system for selecting between a main supply and a battery that selects the main supply when the main supply is within a predetermined range, and selects the battery only when the main supply is out of the predetermined range.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

Figure 1A:
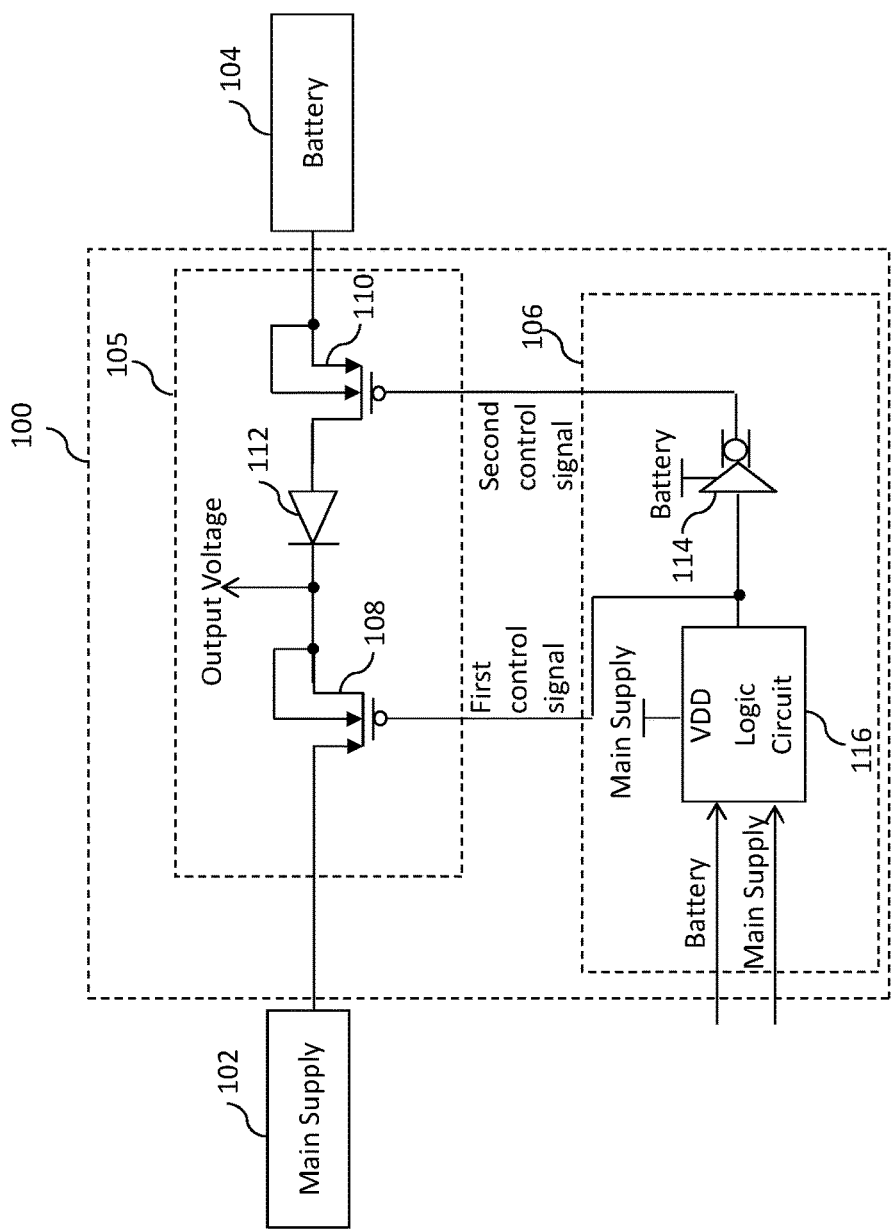
FIGS. 1A-1D are schematic circuit diagrams of various implementations of conventional supply-switching systems.
Figure 1B:
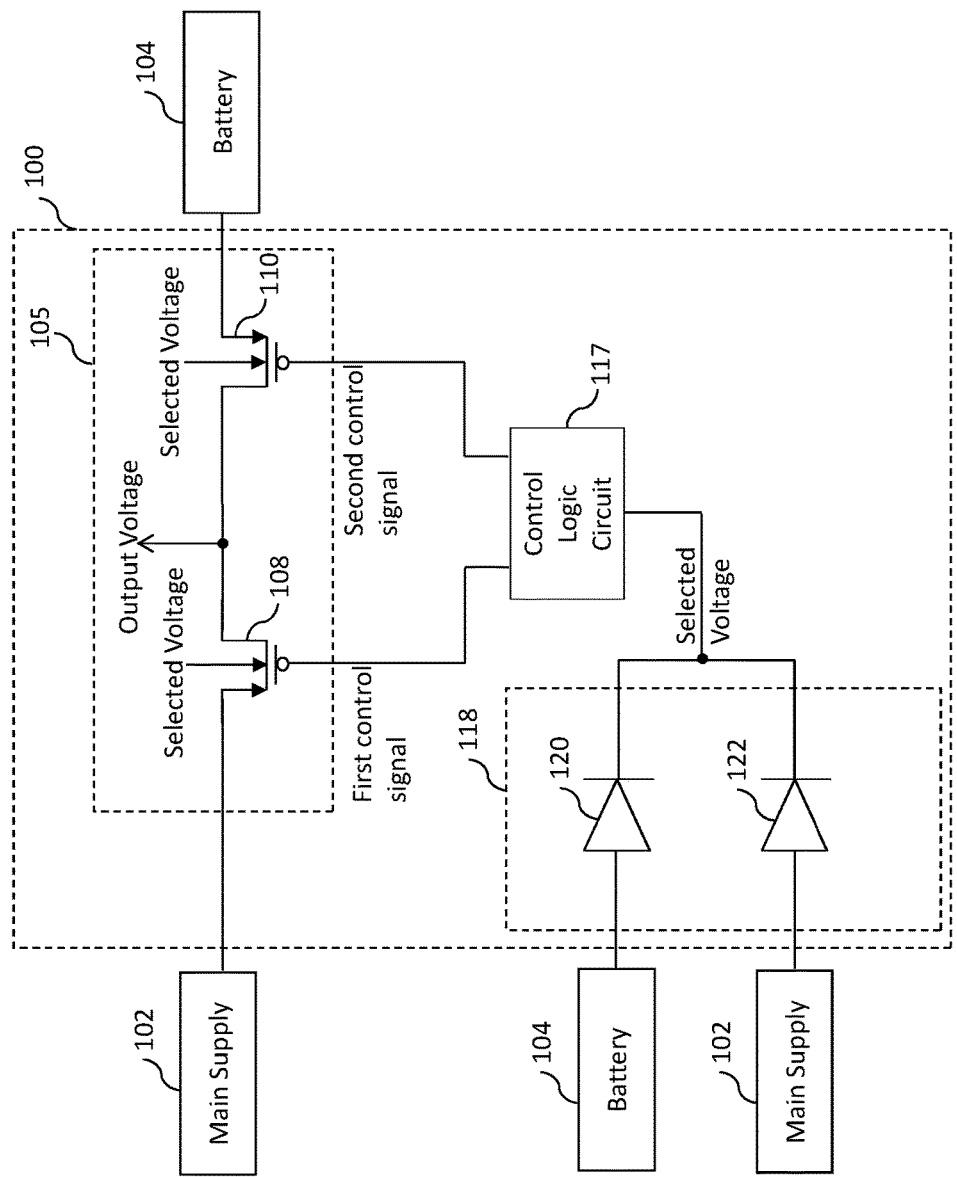
Figure 1C:
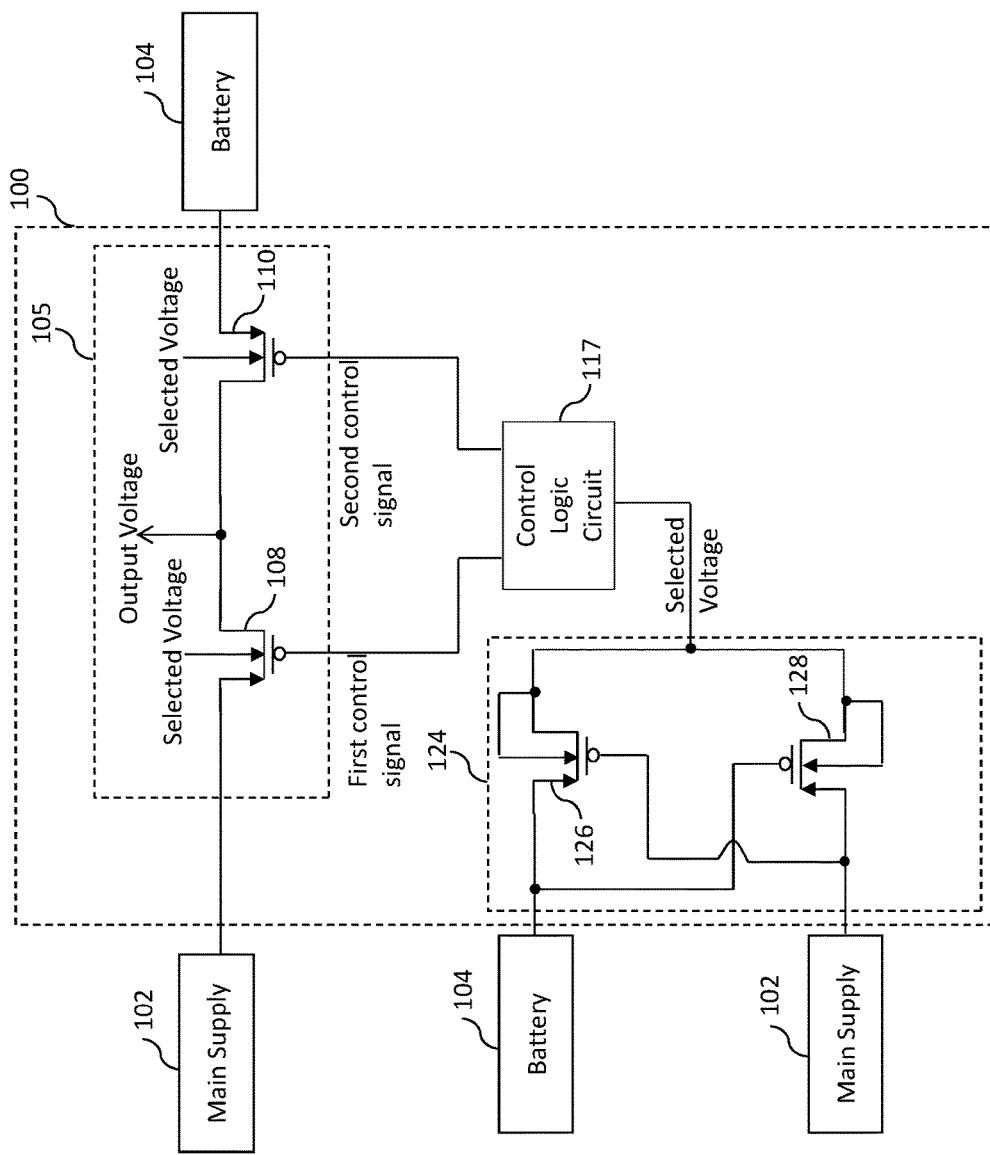
Figure 1D:
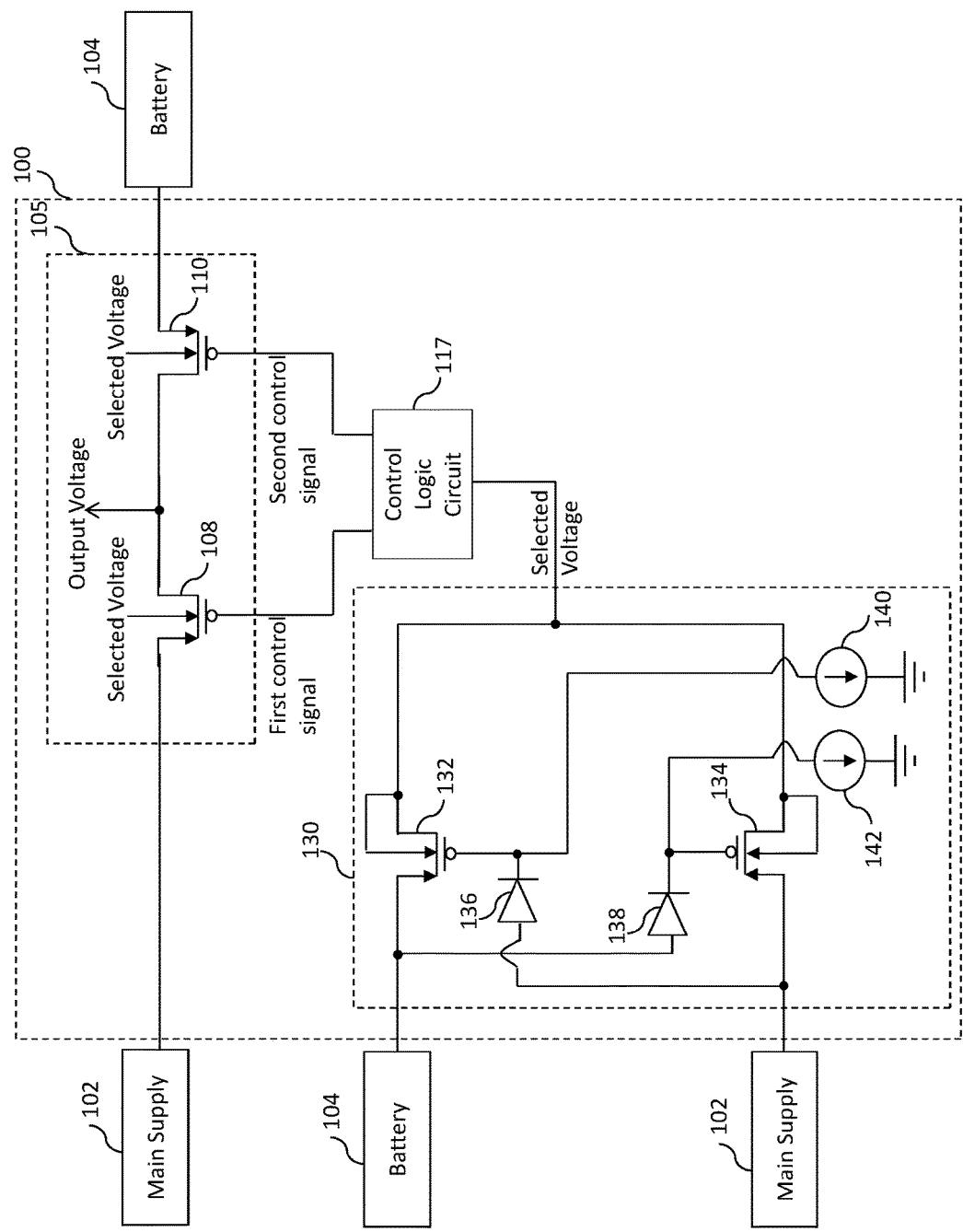

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a supply-selection circuit for selecting a higher of a first voltage generated by a main supply and a second voltage generated by a battery, is provided. The supply-selection circuit includes first through third transistors. The first transistor has a drain terminal connected to its body and gate terminals, and a source terminal connected to the main supply for receiving the first voltage. The drain terminal of the first transistor outputs the first voltage when the first voltage is higher than the second voltage. The second transistor has a drain terminal connected to its body and gate terminals, and a source terminal connected to the main supply for receiving the first voltage. The third transistor has a drain terminal connected to the drain terminal of the first transistor, a body terminal connected to its own drain terminal, a gate terminal connected to the body terminal of the second transistor, and a source terminal connected to the battery for receiving the second voltage. The drain terminal of the third transistor outputs the second voltage when the second voltage is higher than the first voltage.

In another embodiment of the present invention, a system for providing at least one of a first voltage generated by a main supply and a second voltage generated by a battery to an integrated circuit is provided. The system includes a supply-selection circuit, a control logic circuit, and a switching circuit. The supply-selection circuit selects and provides a higher of the first and second voltages as a selected voltage and includes first through third transistors. The first transistor has a drain terminal connected to body and gate terminals thereof, and a source terminal connected to the main supply for receiving the first voltage. The drain terminal of the first transistor outputs the first voltage when the first voltage is higher than the second voltage. The second transistor has a drain terminal connected to body and gate terminals thereof, and a source terminal connected to the main supply for receiving the first voltage. The third transistor has a drain terminal connected to the drain terminal of the first transistor, a body terminal connected to the drain terminal thereof, a gate terminal connected to the body terminal of the second transistor, and a source terminal connected to the battery for receiving the second voltage. The drain terminal of the third transistor outputs the second voltage when the second voltage is higher than the first voltage. The control logic circuit is connected to the supply-selection circuit for receiving the selected voltage and outputting first and second control signals. The switching circuit is connected to the main supply, the battery, the control logic circuit, and the supply-selection circuit for receiving the first voltage, the second voltage, the first and second control signals, and the selected voltage, respectively, and outputting the first voltage based on the first control signal and the second voltage based on the second control signal to the integrated circuit.

In yet another embodiment of the present invention, a system for providing at least one of a first voltage generated by a main supply and a second voltage generated by a battery to an integrated circuit is provided. The system includes a supply-selection circuit, a control logic circuit, and a switching circuit. The supply-selection circuit selects and provides a higher of the first and second voltages as a selected voltage and includes first through third transistors. The first transistor has a drain terminal connected to body and gate terminals thereof, and a source terminal connected to the main supply for receiving the first voltage. The drain terminal of the first transistor outputs the first voltage when the first voltage is higher than the second voltage. The second transistor has a drain terminal connected to body and gate terminals thereof, and a source terminal connected to the main supply for receiving the first voltage. The third transistor has a drain terminal connected to the drain terminal of the first transistor, a body terminal connected to the drain terminal thereof, a gate terminal connected to the body terminal of the second transistor, and a source terminal connected to the battery for receiving the second voltage. The drain terminal of the third transistor outputs the second voltage when the second voltage is higher than the first voltage. The control logic circuit is connected to the drain terminals of the first and third transistors, for receiving the selected voltage, and outputting first and second control signals. The switching circuit includes fourth and fifth transistors. The fourth transistor has a gate terminal connected to the control logic circuit for receiving the first control signal, a body terminal connected to the drain terminals of the first and third transistors for receiving the selected voltage, a source terminal connected to the main supply for receiving the first voltage, and a drain terminal for outputting the first voltage. The fifth transistor has a gate terminal connected to the control logic circuit for receiving the second control signal, a body terminal connected to the drain terminals of the first and third transistors for receiving the selected voltage, a source terminal connected to the battery for receiving the second voltage, and a drain terminal for outputting the second voltage.

Various embodiments of the present invention provide a system for providing at least one of a first voltage generated by a main supply and a second voltage generated by a battery to an integrated circuit. The system includes a supply-selection circuit, a control logic circuit, and a switching circuit. The supply-selection circuit selects and provides a higher of the first and second voltages as a selected voltage and includes first through third transistors. The first transistor receives the first voltage from the main supply and outputs the first voltage when the first voltage is higher than the second voltage. The second transistor receives the first voltage from the main supply and is connected to a fixed-current source. The third transistor receives the second voltage from the battery and outputs the second voltage when the second voltage is higher than the first voltage. The control logic circuit receives the selected voltage from the first and third transistors and outputs first and second control signals. The switching circuit includes fourth and fifth transistors. The fourth and fifth transistors are connected to the control logic circuit for receiving the first and second control signals, respectively. The first and second control signals control a switching of the fourth and fifth transistors, respectively. The selected voltage from the first and third transistors is received by body terminals of the fourth and fifth transistors to suffice the body-bias voltage requirements of the fourth and fifth transistors. The fourth and fifth transistors further receive the first voltage from the main supply and the second voltage from the battery, respectively and provide the first and second voltages to the integrated circuit when the respective transistors are switched on.

The selected voltage received at the body terminals of the fourth and fifth transistors is always the higher of the first and second voltages, thereby meeting the body-bias voltage requirement. As long as the first voltage is within a predetermined range, the first control signal having a logic low state is generated and hence, the fourth transistor remains switched on. When the first voltage is not within the predetermined range, the second control signal having a logic low state is generated and hence, the fifth transistor is switched on. As opposed to conventional supply-switching systems that select and provide a higher of the first and second voltages to the integrated circuit, the system of the present invention provides the first voltage to the integrated circuit as long as the first voltage is within the predetermined range. An inherent make-before-break mechanism exists in the supply-switching system such that the fourth transistor switches off only after the fifth transistor is switched on and vice-versa, thereby eliminating indeterminate output voltage to the integrated circuit. When the integrated circuit operates in a very-low-power (VLP) mode, the control logic circuit always generates the second control signal which is at logic low state, such that the fifth transistor is switched on and the integrated circuit is supplied by the battery. The system of the present invention further reduces leakage of the battery as the battery is not connected to any fixed-current source and hence is not drained continuously as compared to conventional systems, thereby increasing battery life.

Figure 2:
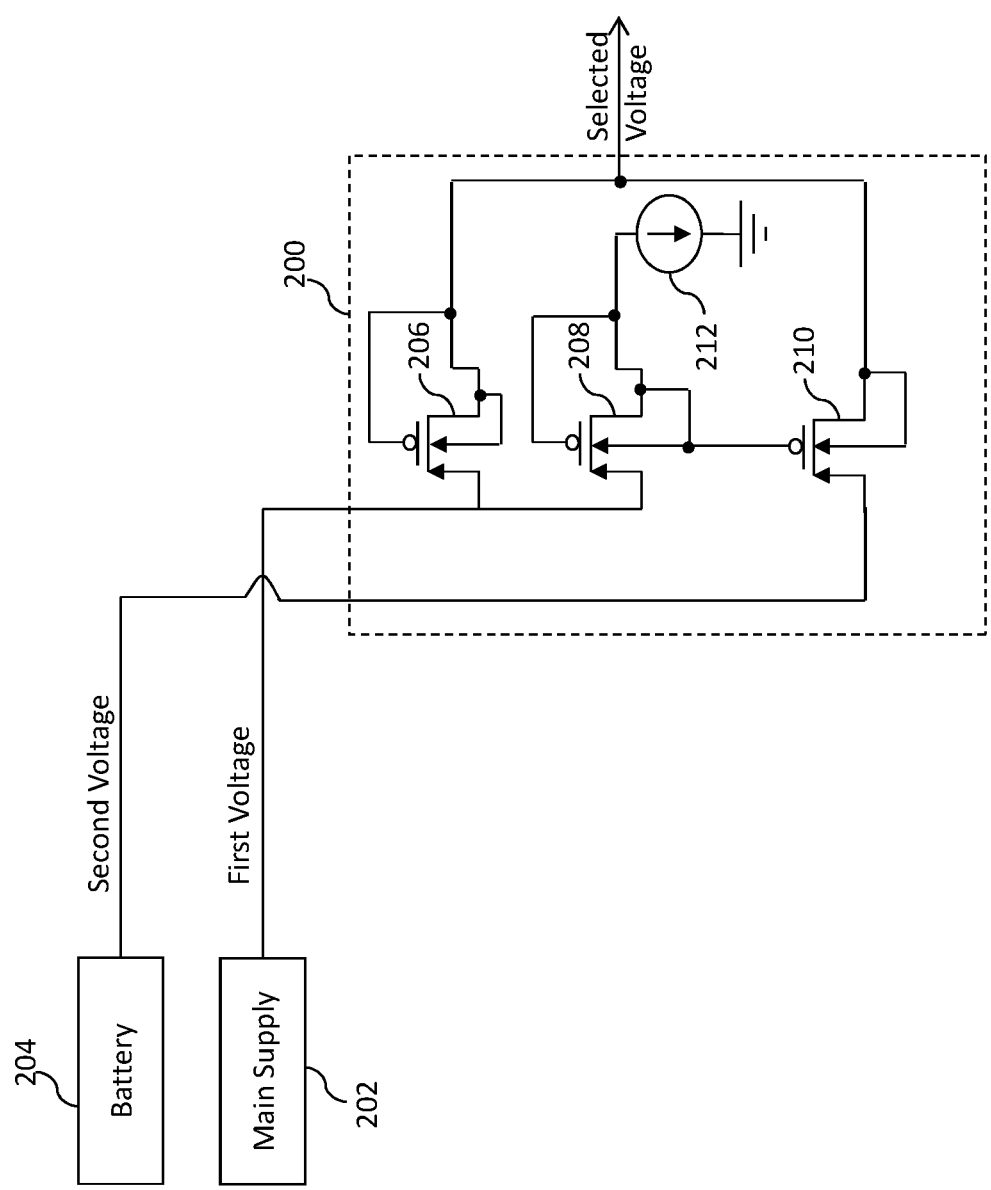
FIG. 2 is a schematic circuit diagram of a supply-selection circuit in accordance with an embodiment of the present invention.

Referring now to FIG. 2, a schematic circuit diagram of a supply-selection circuit 200 in accordance with an embodiment of the present invention is shown. The supply-selection circuit 200 is connected between a main supply 202 and a battery 204 and selects the first voltage from the main supply 202 as long as it is greater than the second voltage from the battery 20-4. The supply-selection circuit 200 includes first through third transistors 206-210 and a fixed-current source 212. A source terminal of the first transistor 206 is connected to the main supply 202 for receiving the first voltage. Body and gate terminals of the first transistor 206 are connected to its drain terminal. A source terminal of the second transistor 208 is connected to the main supply 202 for receiving the first voltage. Body and gate terminals of the second transistor 208 are connected to a drain terminal thereof. The drain terminal of the second transistor 208 is connected to the fixed-current source 212 for tracking the first voltage. Hence, a voltage at the drain terminal of the second transistor 208 is less than the first voltage, due to a voltage drop at the drain terminal thereof that is equal to a source-to-gate voltage ($V_{SG}$) of the second transistor 208. A source terminal of the third transistor 210 is connected to the battery 204 for receiving the second voltage. A gate terminal of the third transistor 210 is connected to the body and drain terminals of the second transistor 208. Drain and body terminals of the third transistor 210 are connected to the drain terminal of the first transistor 206.

During power-up, the first through third transistors 206-210 are switched on as the gate terminals thereof are at logic low state. When the first voltage is greater than the second voltage, a voltage at the drain and gate terminals of the first transistor 206 equals the first voltage that is received at the source terminal thereof. A difference between the voltage at the gate terminal and the first voltage at the source terminal of the first transistor 206 is equal to a threshold voltage of the first transistor 206. Hence, the first transistor 206 remains switched on as the gate terminal thereof is at logic low state. A voltage at the drain terminal of the second transistor 208 is equal to a difference between the first voltage and the voltage drop ($V_{SG}$). A voltage at the source terminal of the second transistor 208 also equals the first voltage. A difference between the voltage at the gate terminal and the first voltage at the source terminal of the second transistor 208 is less than a threshold voltage of the second transistor 208. Hence, the second transistor 208 remains switched on as the gate terminal thereof is at logic low state. A voltage at the drain terminal of the third transistor 210 equals the first voltage and is higher than the second voltage received at the source terminal of the third transistor 210. A voltage at the gate terminal of the third transistor 210 is equal to the voltage at the drain terminal of the second transistor 208. Hence, a difference between the voltage at the gate terminal and the second voltage at the source terminal of the third transistor 210 is greater than a threshold voltage of the third transistor 210. As a result, the gate terminal of the third transistor 210 is set at logic high state thereby switching off the third transistor 210. Hence, the first voltage is selected and output as a selected voltage by the supply-selection circuit 200 when the first voltage is greater than the second voltage.

When the second voltage is greater than the first voltage, a voltage at the drain terminal of the third transistor 210 gradually equals the second voltage received at the source terminal thereof. The voltage at the gate terminal of the third transistor 210 is equal to the voltage at the drain terminal of the second transistor 208, which is further equal to the difference between the first voltage and the voltage drop ($V_{SG}$). Hence, a difference between the voltage at the gate terminal and the second voltage at the source terminal of the third transistor 210 is less than the threshold voltage of the third transistor 210. As a result, the third transistor 210 is switched on as the gate terminal thereof is at logic low state. A voltage at the gate terminal of the second transistor 208 is equal to the voltage at the drain terminal thereof. A difference between the voltage at the gate terminal and the first voltage at the source terminal of the second transistor 208 is less than the threshold voltage of the second transistor 208. Hence, the second transistor 208 remains switched on as the gate terminal thereof is at logic low state. The gate terminal of the first transistor 206 that is connected to the drain terminal of the third transistor 210 receives the second voltage. A difference between the second voltage at the gate terminal and the first voltage at the source terminal of the first transistor 206 is greater than the threshold voltage of the first transistor 206. As a result, the gate terminal of the first transistor 206 is set at logic high state, thereby switching off the first transistor 206. Hence, the second voltage is selected and output as the selected voltage by the supply-selection circuit 200 when the second voltage is higher than the first voltage.

As the body terminals of the first and third transistors 206 and 210 always receive the higher of the first and second voltages, the body-bias voltage requirement of the first and third transistors 206 and 210 is met. Additionally, since there is no fixed-current source connected to the battery 204 in the supply-selection circuit 200, leakage of the battery 204 is eliminated which improves the battery life. The fixed-current source 212 steadily maintains the first voltage at the drain terminal of the second transistor 208 and the gate terminal of the third transistor 210 such that there is no reduction in the second voltage when the second voltage is outputted by the supply-selection circuit 200. This also helps in reducing any leakage from the main supply 202 that is connected to the fixed-current source 212 by way of the second transistor 208.

Figure 3:
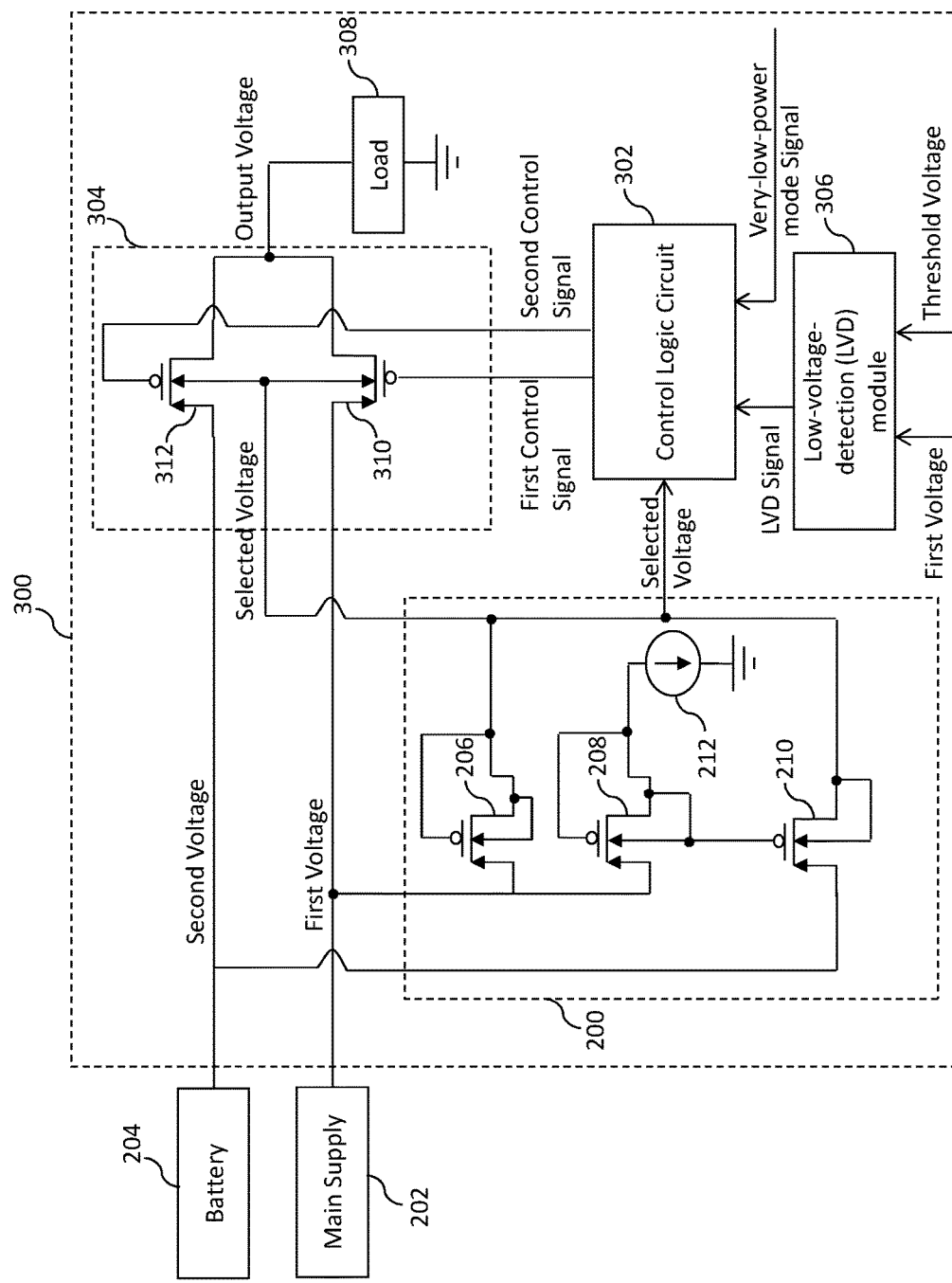
FIG. 3 is a schematic circuit diagram of a supply-switching system in accordance with another embodiment of the present invention.

Referring now to FIG. 3 a schematic circuit diagram of a supply-switching system 300 in accordance with an embodiment of the present invention is shown. The supply-switching system 300 is connected between the main supply 202 and the battery 204 and selects the first voltage supplied by the main supply 202 while the first voltage is within a predetermined range and then switches to the battery 204, which then supplies the second voltage. The supply-switching system 300 includes the supply-selection circuit 200, a control logic circuit 302, a switching circuit 304, a low-voltage detection (LVD) module 306, and a load 308. The supply-switching circuit 304 includes fourth and fifth transistors 310 and 312. It will be apparent to those skilled in the art that the load 308 represents internal components of an integrated circuit (not shown) that includes the supply-switching system 300. The LVD module 306 is connected to the main supply 202 and a threshold voltage source (not shown) for receiving the first voltage and a threshold voltage, respectively, and generating a LVD signal. The control logic circuit 302 is connected to the LVD module 306 for receiving the LVD signal and generating the first and second control signals based on the LVD signal.

The fourth transistor 310 has a source terminal connected to the main supply 202 for receiving the first voltage, a gate terminal connected to the control logic circuit 302 for receiving the first control signal, a drain terminal connected to the load 308 for outputting the first voltage, and a body terminal connected to the drain terminals of the first and third transistors 206 and 210 for receiving the higher of the first and second voltages as the selected voltage. The fifth transistor 312 has a source terminal connected to the battery 204 for receiving the second voltage, a gate terminal connected to the control logic circuit 302 for receiving the second control signal, a drain terminal connected to the load 308 and the drain terminal of the fourth transistor 310 for outputting the second voltage, and a body terminal connected to the drain terminals of the first and third transistors 206 and 210 of the supply-selection circuit 200 for receiving the higher of the first and second voltages as the selected voltage. The selected voltage is supplied as a supply voltage to the control logic circuit 302 by the supply-selection circuit 200.

When the first voltage is greater than the second voltage, the supply-selection circuit 200 selects the first voltage (as discussed above) and provides the first voltage as the selected voltage to the control logic circuit 302. The selected voltage suffices the body-bias voltage requirement of the body terminals of the fourth and fifth transistors 310 and 312, as the selected voltage is always the higher of the first and second voltages. The LVD module 306 compares the first voltage with the threshold voltage. If the first voltage is greater than the threshold voltage then the first voltage is determined to be in the predetermined range and the LVD module 306 generates the LVD signal which is at logic low state. On receiving the LVD signal, the control logic circuit 302 generates the first control signal which is at logic low state. The fourth transistor 310 is switched on when the gate terminal thereof receives the first control signal, which is at logic low state. The control logic circuit 302 generates the second control signal which is at logic high state. The fifth transistor 312 is switched off when the gate terminal thereof receives the second control signal which is at logic high state. As a result, the fourth transistor 310 outputs the first voltage at the drain terminal thereof as an output voltage to the load 308.

When the second voltage is greater than the first voltage, the supply-selection circuit 200 selects and provides the second voltage as the selected voltage to the control logic circuit 302. The selected voltage suffices the body-bias voltage requirement of the body terminals of the fourth and fifth transistors 310 and 312. The LVD module 306 compares the first voltage with the threshold voltage. If the first voltage is greater than the threshold voltage then the first voltage is determined to be in the predetermined range and the LVD module 306 generates a low logic state LVD signal. On receiving the low LVD signal, the control logic circuit 302 generates the first control signal at logic low state. The fourth transistor 310 is switched on when the gate terminal thereof receives the logic low first control signal. The control logic circuit 302 generates the second control signal (which is at logic high state). The fifth transistor 312 is switched off when the gate terminal thereof receives the high second control signal. As a result, the fourth transistor 310 outputs the first voltage at the drain terminal thereof as the output voltage to the load 308 because the first voltage is within the predetermined range in spite of being less than the second voltage.

However, when the LVD module 306 determines that the first voltage is less than the threshold voltage, the LVD signal is generated which is at logic high state. On receiving the high LVD signal, the control logic circuit 302 generates the first control signal which is at logic high state. The fourth transistor 310 is switched off when the gate terminal thereof receives the high first control signal. The control logic circuit 302 generates the second control signal which is at logic low state. The fifth transistor 312 is switched on when the gate terminal thereof receives the low second control signal. As a result, the fifth transistor 312 outputs the second voltage at the drain terminal thereof as the output voltage to the load 308 because the first voltage is not within the predetermined range.

When the integrated circuit that includes the supply-switching system 300 operates in a very-low-power (VLP) mode, most of the internal components of the integrated circuit including the LVD module 306 are switched off to reduce power consumption. As the LVD signal is not generated during the VLP mode, it becomes difficult to determine if the first voltage is within the predetermined range. The control logic circuit 302 receives a VLP mode signal when the IC is in the VLP mode and generates the second control signal which is at logic low state. The second control signal switches on the fifth transistor 312. As a result, the fifth transistor 312 outputs the second voltage at the drain terminal thereof as an output voltage to the load 308. Hence, in the VLP mode, the IC is powered by the second voltage supplied by the battery 204.

In various embodiment of the present invention, the first through fifth transistors (206, 208, 210, 310, and 312) are p-channel metal-oxide semiconductor (PMOS) transistors.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A system for providing at least one of a first voltage generated by a main supply and a second voltage generated by a battery to an integrated circuit, the system comprising:
   a supply-selection circuit for selecting and providing a higher of the first and second voltages as a selected voltage, comprising:
      a first transistor having a drain terminal connected to body and gate terminals thereof, and a source terminal connected to the main supply for receiving the first voltage, wherein the drain terminal thereof outputs the first voltage when the first voltage is higher than the second voltage;
      a second transistor having a drain terminal connected to body and gate terminals thereof, and a source terminal connected to the main supply for receiving the first voltage; and
      a third transistor having a drain terminal connected to the drain terminal of the first transistor, a body terminal connected to the drain terminal thereof, a gate terminal connected to the body terminal of the second transistor, and a source terminal connected to the battery for receiving the second voltage, wherein the drain terminal thereof outputs the second voltage when the second voltage is higher than the first voltage;
   a control logic circuit, connected to the supply-selection circuit, for receiving the selected voltage and outputting first and second control signals; and
   a switching circuit, connected to the main supply, the battery, the control logic circuit, and the supply-selection circuit for receiving the first voltage, the second voltage, the first and second control signals, and the selected voltage, respectively, and outputting the first voltage based on the first control signal and the second voltage based on the second control signal to the integrated circuit.

2. The system of claim 1, wherein the switching circuit includes:
   a fourth transistor having a gate terminal connected to the control logic circuit for receiving the first control signal, a body terminal connected to the drain terminals of the first and third transistors for receiving the selected voltage, a source terminal connected to the main supply for receiving the first voltage, and a drain terminal for outputting the first voltage; and
   a fifth transistor having a gate terminal connected to the control logic circuit for receiving the second control signal, a body terminal connected to the drain terminals of the first and third transistors for receiving the selected voltage, a source terminal connected to the battery for receiving the second voltage, and a drain terminal for outputting the second voltage.

3. The system of claim 2, wherein the first, second, third, fourth, and fifth transistors each comprise of a p-channel metal-oxide semiconductor (PMOS) transistor.

4. The system of claim 1, wherein the system further comprises a low-voltage-detection (LVD) module, connected to the main supply, for receiving the first voltage and a threshold voltage, and outputting an LVD signal when the first voltage is less than the threshold voltage.

5. The system of claim 4, wherein the control logic circuit further receives the LVD signal and outputs the first and second control signals.

6. The system of claim 1, wherein the control logic circuit further receives a very-low-power (VLP) mode signal and generates the second control signal.

7. The system of claim 6, wherein the switching circuit receives the second control signal and outputs the second voltage.

8. The system of claim 1, wherein the supply-selection circuit further provides the selected voltage to the control logic circuit for powering the control logic circuit.

9. The system of claim 1, further comprising a fixed-current source, connected between the drain terminal of the second transistor and ground, for regulating a drain current of the second transistor.

10. A system for providing at least one of a first voltage generated by a main supply and a second voltage generated by a battery to an integrated circuit, the system comprising:
   a supply-selection circuit for selecting and providing a higher of the first and second voltages as a selected voltage, comprising:
      a first transistor, having a drain terminal connected to body and gate terminals thereof, and a source terminal connected to the main supply for receiving the first voltage, wherein the drain terminal thereof outputs the first voltage when the first voltage is higher than the second voltage;

a second transistor, having a drain terminal connected to body and gate terminals thereof, and a source terminal connected to the main supply for receiving the first voltage; and a third transistor, having a drain terminal connected to the drain terminal of the first transistor, a body terminal connected to the drain terminal thereof, a gate terminal connected to the body terminal of the second transistor, and a source terminal connected to the battery for receiving the second voltage, wherein the drain terminal thereof outputs the second voltage when the second voltage is higher than the first voltage;

a control logic circuit, connected to the drain terminals of the first and third transistors, for receiving the selected voltage, and outputting first and second control signals; and a switching circuit, including:

a fourth transistor, having a gate terminal connected to the control logic circuit for receiving the first control signal, a body terminal connected to the drain terminals of the first and third transistors for receiving the selected voltage, a source terminal connected to the main supply for receiving the first voltage, and a drain terminal for outputting the first voltage; and a fifth transistor, having a gate terminal connected to the control logic circuit for receiving the second control signal, a body terminal connected to the drain terminals of the first and third transistors for receiving the selected voltage, a source terminal connected to the battery for receiving the second voltage, and a drain terminal for outputting the second voltage.

11. The system of claim 10, wherein the system further comprises a low-voltage-detection (LVD) module, connected to the main supply, for receiving the first voltage and a threshold voltage, and outputting an LVD signal when the first voltage is less than the threshold voltage.

12. The system of claim 11, wherein the control logic circuit further receives the LVD signal and outputs the first and second control signals.

13. The system of claim 10, wherein the control logic circuit further receives a very-low-power (VLP) mode signal and generates the second control signal.

14. The system of claim 13, wherein the switching circuit receives the second control signal and outputs the second voltage.

15. The system of claim 10, wherein the supply-selection circuit further provides the selected voltage to the control logic circuit, for powering the control logic circuit.

16. The system of claim 10, further comprising a fixed-current source, connected between the drain terminal of the second transistor and ground, for regulating a drain current of the second transistor.

17. The system of claim 10, wherein the first, second, third, fourth, and fifth transistors each comprise of a p-channel metal-oxide semiconductor (PMOS) transistor.

* * * * *